(12) United States Patent
Song et al.

(10) Patent No.: US 11,658,024 B2
(45) Date of Patent: May 23, 2023

(54) SEMICONDUCTOR DEVICE AND METHOD OF MANUFACTURING THE SAME

(71) Applicant: Samsung Electronics Co., Ltd., Suwon-si (KR)

(72) Inventors: Jeonggyu Song, Seongnam-si (KR); Kyooho Jung, Seoul (KR); Yongsung Kim, Suwon-si (KR); Jeongil Bang, Suwon-si (KR); Jooho Lee, Hwaseong-si (KR); Junghwa Kim, Yongin-si (KR); Haeryong Kim, Seunnam-si (KR); Myoungho Jeong, Seongnam-si (KR)

(73) Assignee: Samsung Electronics Co.. Ltd., Gyeonggi-do (KR)

( * ) Notice: Subject to any disclaimer, the term of this patent is extended or adjusted under 35 U.S.C. 154(b) by 194 days.

(21) Appl. No.: 17/071,310

(22) Filed: Oct. 15, 2020

(65) Prior Publication Data

US 2021/0043445 A1 Feb. 11, 2021

Related U.S. Application Data

(63) Continuation of application No. 16/520,990, filed on Jul. 24, 2019, now Pat. No. 10,867,784.

(30) Foreign Application Priority Data

Feb. 26, 2019 (KR) .......................... 10-2019-0022733

(51) Int. Cl.
*H01L 21/02* (2006.01)
*H01L 29/786* (2006.01)
(Continued)

(52) U.S. Cl.
CPC .... *H01L 21/02181* (2013.01); *H01L 21/0245* (2013.01); *H01L 21/02381* (2013.01);
(Continued)

(58) Field of Classification Search
CPC ......... H01L 21/02181; H01L 21/02381; H01L 21/02389; H01L 21/02403; H01L 21/0245;
(Continued)

(56) References Cited

U.S. PATENT DOCUMENTS 7,691,701 B1 4/2010 Belyansky et al.
7,791,125 B2 9/2010 Choi et al.
(Continued)

FOREIGN PATENT DOCUMENTS

JP          4552973 B2    9/2010
JP    WO2011101931 A1    6/2013
(Continued)

OTHER PUBLICATIONS

M. H. Park and Y. J. Kim, 'The effects of crystallographic orientation and strain of thin Hf0.5Zr0.5O2 film on its ferroelectricity,' *Applied Physics Letters*, vol. 104, 072901, Jan. 2014.
(Continued)

*Primary Examiner* — Victor A Mandala
*Assistant Examiner* — Colleen E Snow
(74) *Attorney, Agent, or Firm* — Harness, Dickey & Pierce, P.L.C.

(57) ABSTRACT

A semiconductor device and a method of manufacturing the semiconductor device are included. The method of manufacturing the semiconductor device includes forming a hafnium oxide layer on a substrate and crystallizing the hafnium oxide layer by using a hafnium cobalt oxide layer as a seed layer. According to the method of manufacturing the semiconductor device, a thin-film hafnium oxide layer may be easily crystallized.

10 Claims, 11 Drawing Sheets

(51) Int. Cl.
*H01L 29/66* (2006.01)
*H01L 21/768* (2006.01)

(52) U.S. Cl.
CPC .. *H01L 21/02389* (2013.01); *H01L 21/02403* (2013.01); *H01L 21/02472* (2013.01); *H01L 21/02667* (2013.01); *H01L 21/76871* (2013.01); *H01L 29/66969* (2013.01); *H01L 29/7869* (2013.01)

(58) Field of Classification Search
CPC ......... H01L 21/02472; H01L 21/02667; H01L 21/76871; H01L 29/66969; H01L 29/7869
See application file for complete search history.

(56) References Cited

U.S. PATENT DOCUMENTS

| | | | |
|---|---|---|---|
| 9,064,802 B2 | 6/2015 | Watanabe | |
| 9,218,977 B2 | 12/2015 | Won et al. | |
| 2002/0064970 A1* | 5/2002 | Chooi | H01L 21/31691 438/785 |
| 2005/0184348 A1 | 8/2005 | Youn et al. | |
| 2006/0208338 A1 | 9/2006 | Lee et al. | |
| 2012/0037902 A1* | 2/2012 | Srividya | H01L 21/02189 257/43 |
| 2012/0187563 A1 | 7/2012 | Hsieh et al. | |
| 2012/0299113 A1 | 11/2012 | Endo et al. | |
| 2019/0013391 A1* | 1/2019 | Moon | H01L 29/152 |
| 2020/0098926 A1 | 3/2020 | Sharma et al. | |

FOREIGN PATENT DOCUMENTS

| | | |
|---|---|---|
| KR | 20020034710 A | 5/2002 |
| KR | 101234690 B1 | 2/2013 |
| KR | 20140051602 A | 5/2014 |

OTHER PUBLICATIONS

M. H. Park et al., 'Understanding the formation of the metastable ferroelectric phase in hafnia-zirconia solid solution thin films,' *Nanoscale*, vol. 10, 2018, pp. 716-725.

S. Mueller et al., 'Incipient Ferroelectricity in Al-Doped $HfO_2$ Thin Films,' *Advanced Functional Materials*, vol. 22, 2012, pp. 2412-2417.

J. Mueller et al., 'Ferroelectricity in Simple Binary $ZrO_2$ and $HfO_2$,' *Nano Letters*, vol. 12, 2012, pp. 4318-4323.

K. D. Kim et al., 'Ferroelectricity in undoped-$HfO_2$ thin films induced by deposition temperature control during atomic layer deposition,' *Journal of Materials Chemistry C.*, vol. 4, 2016, pp. 6864-6872.

\* cited by examiner

SEMICONDUCTOR DEVICE AND METHOD OF MANUFACTURING THE SAME

CROSS-REFERENCE TO RELATED APPLICATION

This application is a continuation of U.S. patent application Ser. No. 16/520,990, filed on Jul. 24, 2019, which claims the benefit of Korean Patent Application No. 10-2019-0022733, filed on Feb. 26, 2019, in the Korean Intellectual Property Office, the disclosure of each of which is incorporated herein in its entirety by reference.

BACKGROUND

1. Field

The present disclosure relates to semiconductor devices and methods of manufacturing the same.

2. Description of the Related Art

A metal oxide semiconductor (MOS) transistor, which is a basic circuit of a large-scale integrated circuit (LSI), frequently includes silicone dioxide ($SiO_2$) as a gate insulating layer. Silicon dioxide has the problem of higher power consumption due to an increased direct tunneling leakage current and degraded reliability of an insulating layer. Also, $SiO_2$ having a small thickness has a weaker diffusion barrier against impurities, and thus, causes leakage of impurities from a gate electrode.

To over the limitations of silicon dioxide, high-k materials that allow field-effect performance despite its greater thickness than $SiO_2$ have been developed. Examples of the high-k materials include Group IV oxides, Group III oxides, or the like.

SUMMARY

Provided are methods of manufacturing a semiconductor device including a high-k thin film.

Provided are semiconductor devices including a high-k thin film.

Additional aspects will be set forth in part in the description which follows and, in part, will be apparent from the description, or may be learned by practice of the presented embodiments.

According to an aspect of an embodiment, a method of manufacturing a semiconductor device, includes: forming a hafnium oxide (HfOx) layer on a substrate; forming a hafnium cobalt oxide (HfCoOx) layer on the hafnium oxide layer; and crystallizing the hafnium oxide layer using a heat treatment process.

The hafnium oxide layer may be a Group IV or Group III oxide, or a combination thereof.

The hafnium oxide layer may further include $ZrO_2$, $Al_2O_3$, $TiO_2$, $Sc_2O_3$, $Y_2O_3$, or a combination thereof.

The hafnium oxide layer may have a thickness equal to or less than 7 nm.

The hafnium oxide layer may be formed using an atomic layer deposition method.

The hafnium cobalt oxide layer may have a thickness equal to or less than 3 nm.

The hafnium cobalt oxide layer may have a cobalt content of 10% or less.

The substrate may include at least one material selected from the group consisting of Al, Si, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, BaHf, Ta, W, Re, Os, Ir, Pt, and Au or a material including the at least one material and a nitride or an oxide.

The hafnium oxide layer may be crystallized in an orthorhombic phase or a tetragonal phase.

A silicon dioxide layer may be further formed between the substrate and the hafnium oxide layer.

According to an aspect of another embodiment, a semiconductor device includes: a substrate; a crystallized hafnium oxide (HfOx) layer crystallized on the substrate; and a hafnium cobalt oxide (HfCoOx) layer provided on the hafnium oxide layer.

The substrate may include a titanium nitride or an aluminum nitride, and the semiconductor device may further include an electrode on the hafnium cobalt oxide layer.

The substrate may include silicon or germanium, and the semiconductor device may further include a silicon dioxide layer between the substrate and the hafnium oxide layer and an electrode on the hafnium cobalt oxide layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
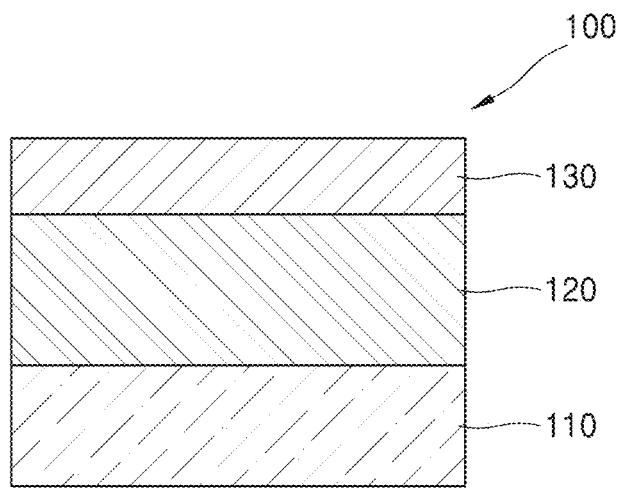
FIG. 1 is a schematic view illustrating a semiconductor device according to an embodiment.

Hereinafter, a semiconductor device and a manufacturing method thereof according to various embodiments will be described more fully with reference to the accompanying drawings. In the drawings, like elements are labeled like reference numerals, and the sizes of elements in the drawings may be exaggerated for clarity and convenience of description. While such terms as "first," "second," etc., may be used to describe various elements, such elements must not be limited to the above terms. The above terms are used only to distinguish one element from another.

An expression used in the singular form encompasses the expression in the plural form, unless it has a clearly different meaning in the context. It will also be understood that when a component "includes" an element, unless there is another opposite description thereto, it should be understood that the component does not exclude another element but may further include another element. Also, in the drawings, for clarity of description, sizes or thicknesses of elements may be exaggerated. Also, it will also be understood that when a material layer is referred to as being "on" another substrate or layer, it can be directly on the other substrate or layer, or intervening layers may also be present. In addition, materials constituting each layer in the embodiments below are exemplary, and other materials than the described ones may also be used.

FIG. 1 is a schematic view illustrating a semiconductor device 100 according to an embodiment.

The semiconductor device 100 may include a substrate 110, a hafnium oxide (HfOx) layer 120 that is crystallized and provided on the substrate 110, and/or a hafnium cobalt oxide (HfCoOx) layer 130 provided on the hafnium oxide layer 120. Alternatively, cobalt may be diffused in the hafnium oxide layer 120. The hafnium oxide (HfOx) layer 120 may be another Group IV oxide, for example, $TiO_2$ or $ZrO_2$ or may also be a Group III oxide, for example, $Sc_2O_3$ or $Y_2O_3$, or combinations thereof.

The substrate 110 may include, for example, at least one material selected from the group consisting of Al, Si, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, BaHf, Ta, W, Re, Os, Ir, Pt, and Au or may further include a nitride or an oxide in addition to the at least one material.

The hafnium oxide layer 120 may include a crystal phase. For example, the hafnium oxide layer 120 may include an orthorhombic phase or a tetragonal phase. The hafnium oxide layer 120 may include, for example, hafnium dioxide ($HfO_2$).

The hafnium oxide layer 120 may have, for example, a thickness equal to or less than 7 nm. The hafnium oxide layer 120 may have a high permittivity when the hafnium oxide layer 120 has a thickness of 7 nm or less and is crystallized, and may be applied as a high-k layer to a ferroelectric field effect transistor.

The hafnium oxide layer 120 may have a higher permittivity by further including, for example, $ZrO_2$ or $Al_2O_3$.

The hafnium cobalt oxide layer 130 may have, for example, a thickness equal to or less than 3 nm. The hafnium cobalt oxide layer 130 may have a cobalt content of 10% or less. The hafnium cobalt oxide layer 130 may include a hafnium cobalt oxide compound. The hafnium cobalt oxide compound may be a compound including HfCoOx and at least one selected from the group consisting of Be, B, Na, Mg, Al, Si, K, Ca, Sc, Ti, V, Cr, Mn, Fe, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Ta, W, Re, Os, Ir, Pt, Au, Hg, Tl, Pb, Bi, Po, Fr, Ra, Ac, Th, Pa, and U.

Figure 2:
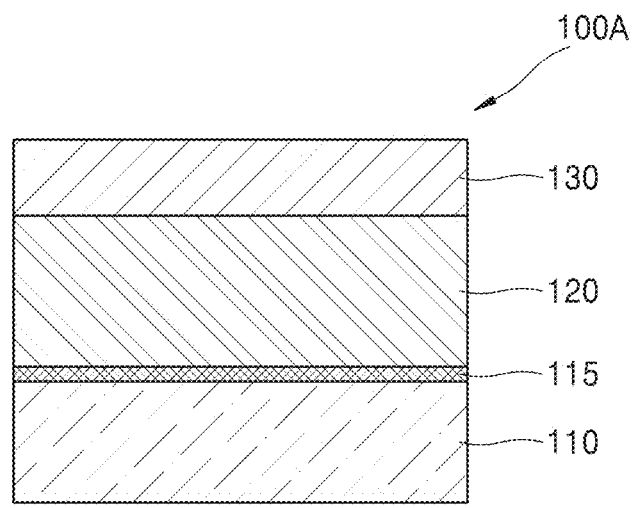
FIG. 2 illustrates an example in which a silicon dioxide layer is further included in the semiconductor device illustrated in FIG. 1.

FIG. 2 illustrates an example in which a layer is further included in the semiconductor device illustrated in FIG. 1.

A semiconductor device 100A may further include a silicon dioxide ($SiO_2$) layer 115 between the substrate 110 and the hafnium oxide layer 120. For example, when the substrate 110 is a silicon substrate, the semiconductor device 100A may be applied to a metal oxide semiconductor (MOS) device.

Figure 3:
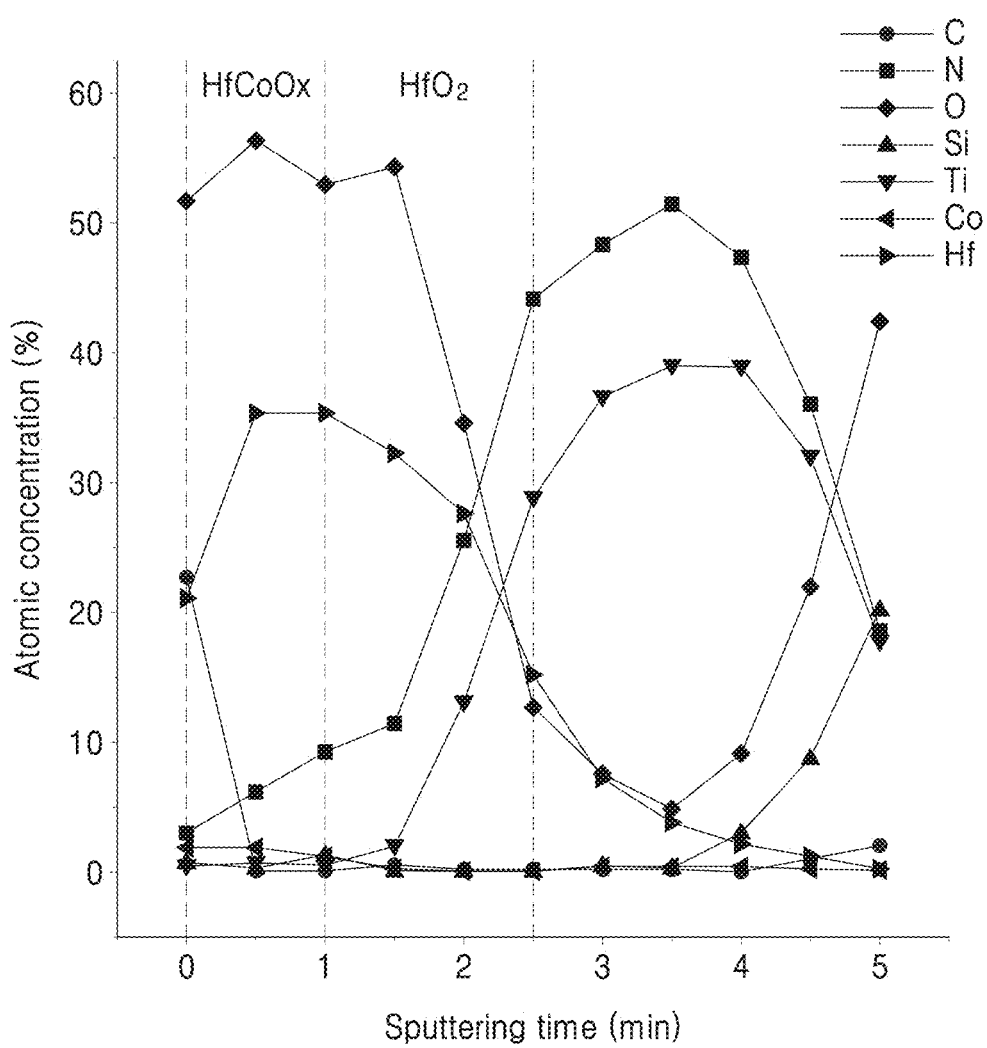
FIG. 3 is an atom density graph according to a sputtering time with respect to the semiconductor device illustrated in FIG. 1.

FIG. 3 is an atom density graph according to a sputtering time with respect to the semiconductor device 100 illustrated in FIG. 1, obtained through X-ray photoelectron spectroscopy (XPS). That is, FIG. 3 shows a result of atom density analysis performed on each layer of the semiconductor device 100.

Referring to FIG. 3, a hafnium cobalt oxide layer and a hafnium oxide layer are included, and the hafnium oxide layer has a thickness of about 6 nm.

Figure 4:
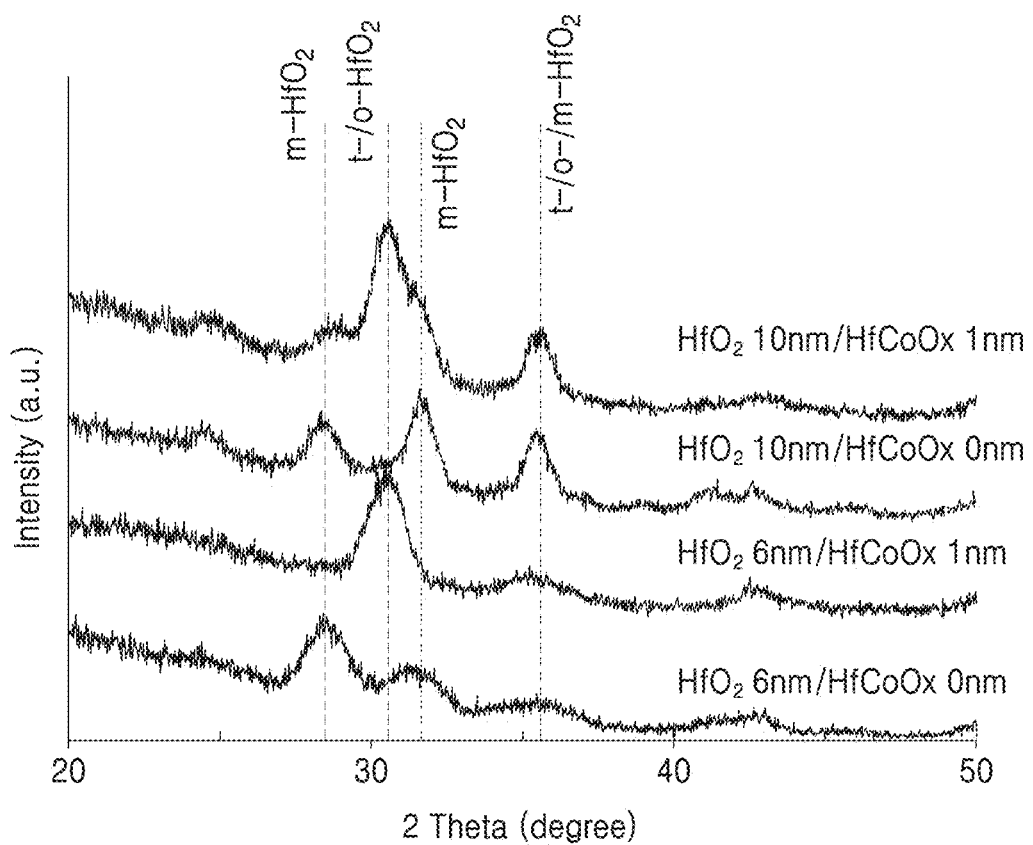
FIG. 4 shows a variation in an intensity of a hafnium oxide layer having a thickness or 6 nm and a hafnium oxide layer having a thickness of 10 nm, according to a diffraction angle in an X-ray diffraction analysis method.

FIG. 4 shows a variation in an intensity of a hafnium oxide layer having a thickness or 6 nm and a hafnium oxide layer having a thickness of 10 nm, according to a diffraction angle in an X-ray diffraction analysis (XRD) method. The graphs respectively show variations in intensities of $HfO_2$ 10 nm/HfCoOx 1 nm, $HfO_2$ 10 nm/HfCoOx 0 nm, $HfO_2$ 6 nm/HfCoOx 1 nm, and $HfO_2$ 6 nm/HfCoOx 0 nm. In a crystallized hafnium oxide layer, one peak value occurs at an angle of approximately 30 degrees. That is, in $HfO_2$ 6 nm/HfCoOx 1 nm, a peak value occurs at approximately 30 degrees, whereas in $HfO_2$ 10 nm/HfCoOx 1 nm, $HfO_2$ 10 nm/HfCoOx 0 nm, and $HfO_2$ 6 nm/HfCoOx 0 nm, a peak value does not occur at approximately 30 degrees but at an angle deviating from 30 degrees or multiple peak values occur. This indicates that a thin-film hafnium oxide layer having a thickness of 6 nm is orthorhombic-crystallized or tetragonally crystallized due to the hafnium cobalt oxide layer.

Also, when the hafnium oxide layer has a thickness of 10 nm or there is no hafnium cobalt oxide layer, crystallization is not properly performed, but the hafnium oxide layer has monoclinic crystallinity. In the graphs, "m" indicates monoclinic crystallinity, "t" denotes tetragonal crystallinity, and "o" indicates orthorhombic crystallinity.

Figure 5:
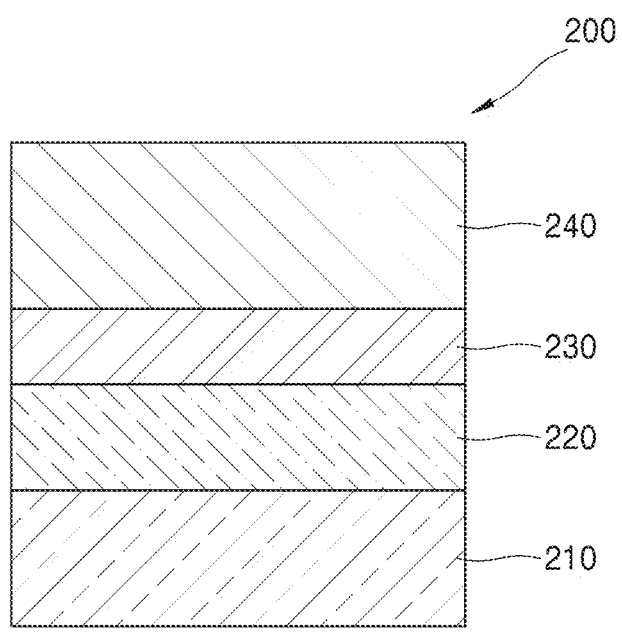
FIG. 5 is a schematic view of a semiconductor device according to another embodiment.

FIG. 5 is a schematic view of a semiconductor device 200 according to another embodiment.

The semiconductor device 200 may include a substrate 210, a hafnium oxide layer 220, and a hafnium cobalt oxide layer 230, and/or a top electrode 240. The substrate 210 may include, for example, a conductive material, and act as a bottom electrode. The substrate 210 may include, for example, TiN or AlN, but is not limited thereto. The hafnium cobalt oxide layer 230 may include a hafnium cobalt oxide compound. The hafnium cobalt oxide compound may be a compound including HfCoOx and at least one material selected from the group consisting of Be, B, Na, Mg, Al, Si, K, Ca, Sc, Ti, V, Cr, Mn, Fe, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Ta, W, Re, Os, Ir, Pt, Au, Hg, Tl, Pb, Bi, Po, Fr, Ra, Ac, Th, Pa, and U.

The top electrode 240 may include, for example, at least one material selected from the group consisting of Al, Si, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, BaHf, Ta, W, Re, Os, Ir, Pt, and Au or may further include a nitride or an oxide in addition to the at least one material. However, the top electrode 240 is not limited thereto. As described above, the semiconductor device 200 may include the substrate 210 operating as an electrode and the top electrode 240 and applied to a metal insulator metal (MIM) capacitor.

Figure 6:
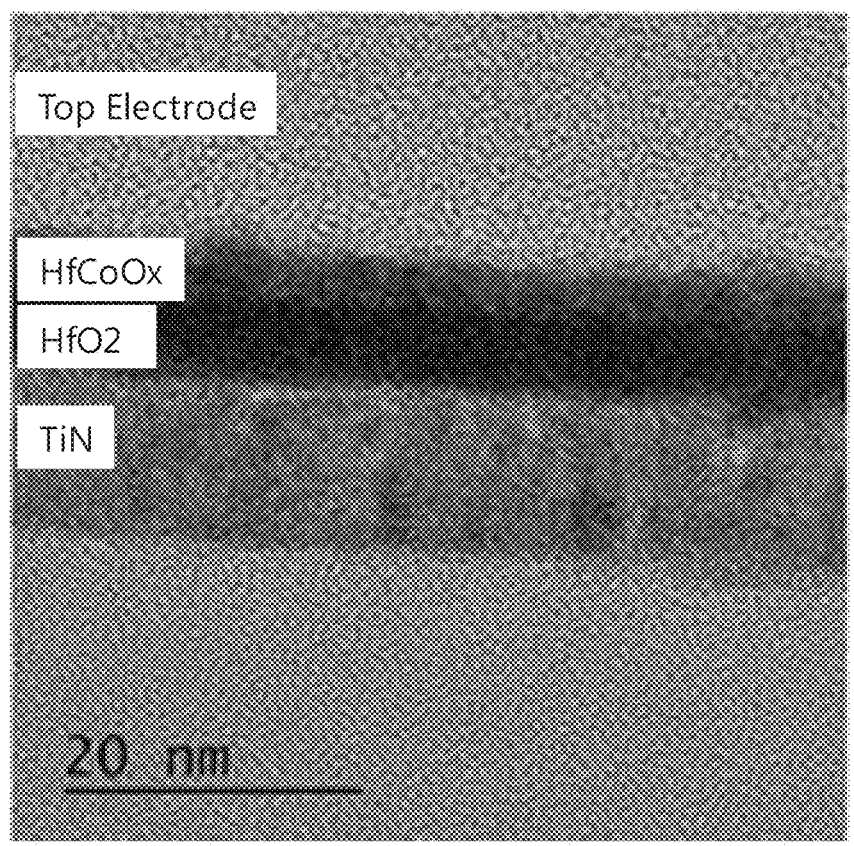
FIG. 6 is a transmission electron microscopic image of a layer structure including a TiN layer, a crystallized $HfO_2$ layer, a HfCoOx layer, and a top electrode.

FIG. 6 is a transmission electron microscopic image of a layer structure including a crystallized $HfO_2$ layer, a HfCoOx layer, and a top electrode. The crystallized $HfO_2$ layer has a thickness of approximately 6 nm.

Figure 7:
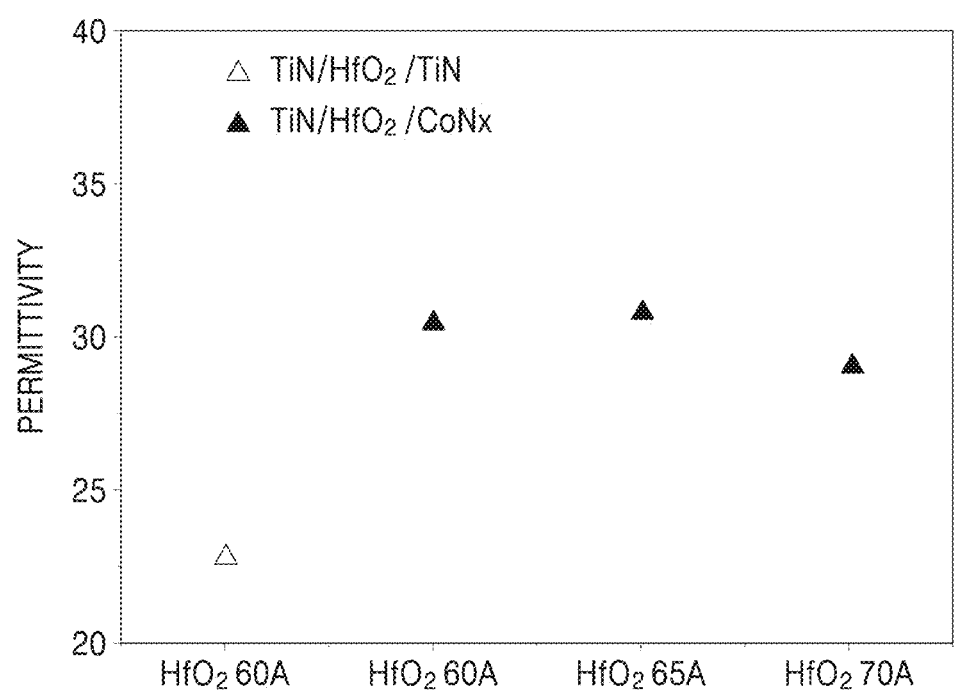
FIG. 7 shows a permittivity of $HfO_2$ according to a thickness of $HfO_2$ in the layer structure illustrated in FIG. 6.

FIG. 7 shows a permittivity of $HfO_2$ according to a thickness of $HfO_2$ in the layer structure illustrated in FIG. 6. The white triangles indicate a $TiN/HfO_2/TiN$ layer structure, and the black triangles indicate a TiN/HfO₂/HfCoOx/TiN layer structure. In the TiN/HfO₂/TiN layer structure, a permittivity of HfO₂ having a thickness of 6 nm is relatively low, and in the TiN/HfO₂/HfCoOx/TiN layer structure, a permittivity of HfO₂ having a thickness of 6 nm is relatively high. For example, HfO₂ of the semiconductor device according to the embodiment may have a permittivity in a range from about 30 to about 70.

Figure 8:
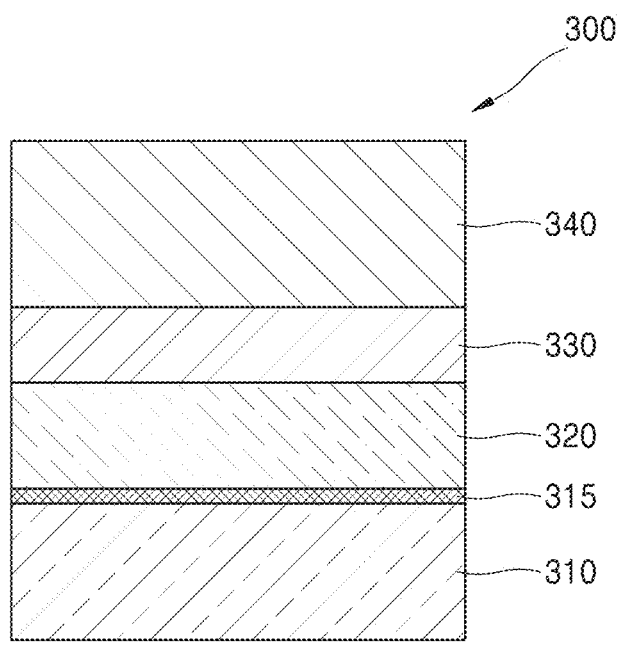
FIG. 8 illustrates a semiconductor device according to another embodiment.

FIG. 8 illustrates a semiconductor device according to another embodiment.

A semiconductor device 300 may include a substrate 310, a silicon dioxide layer (SiO₂) 315, and a crystallized hafnium oxide layer 320, and/or an electrode 340. The substrate 310 may include, for example, a semiconductor substrate. For example, the substrate 310 may include silicon (Si) or germanium (Ge). The electrode 340 may include at least one material selected from the group consisting of Al, Si, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, BaHf, Ta, W, Re, Os, Ir, Pt, and Au or a material including the at least one material and a nitride or an oxide. However, the semiconductor device 300 is not limited thereto. As described above, the semiconductor device 300 may include the substrate 310 and the electrode 340 and may be applied to a MOS capacitor.

Figure 9:
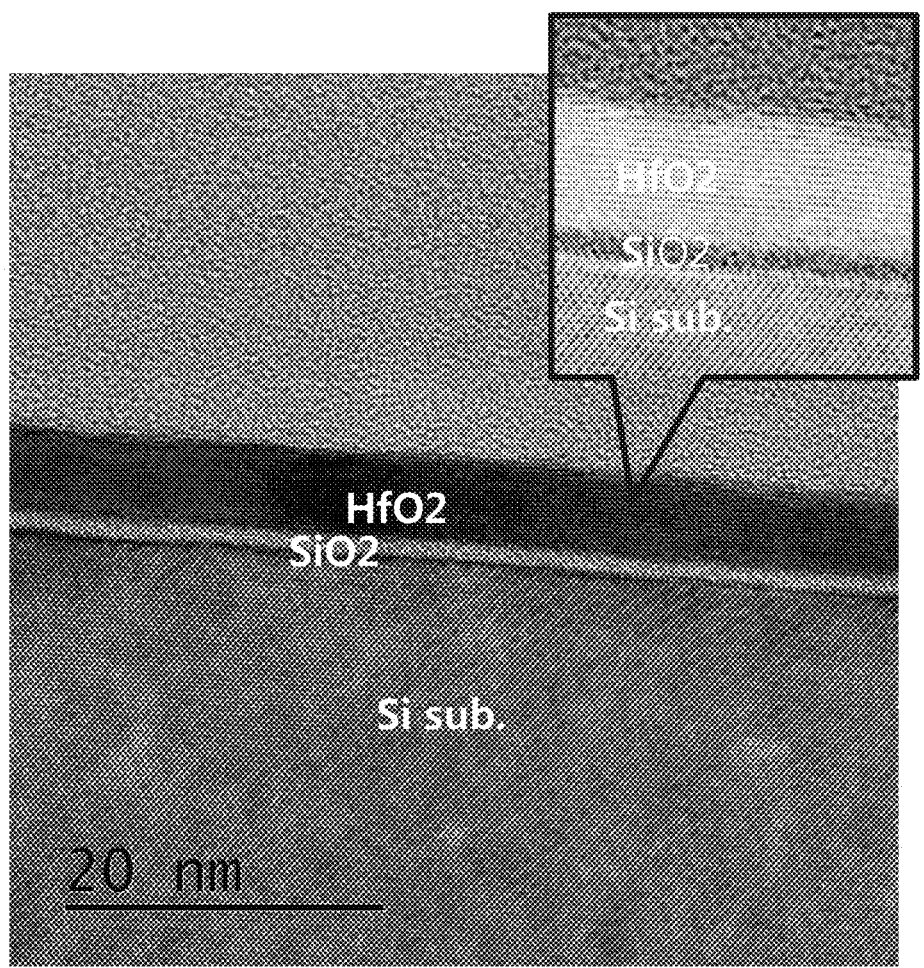
FIG. 9 is a transmission electron microscopic image of a layer structure including a silicon substrate, a $SiO_2$ layer, and a $HfO_2$ layer.

FIG. 9 is a transmission electron microscopic image of a layer structure including a silicon substrate, a SiO₂ layer, and/or an HfO₂ layer. The HfO₂ layer has a thickness of approximately 5 nm.

Figure 10:
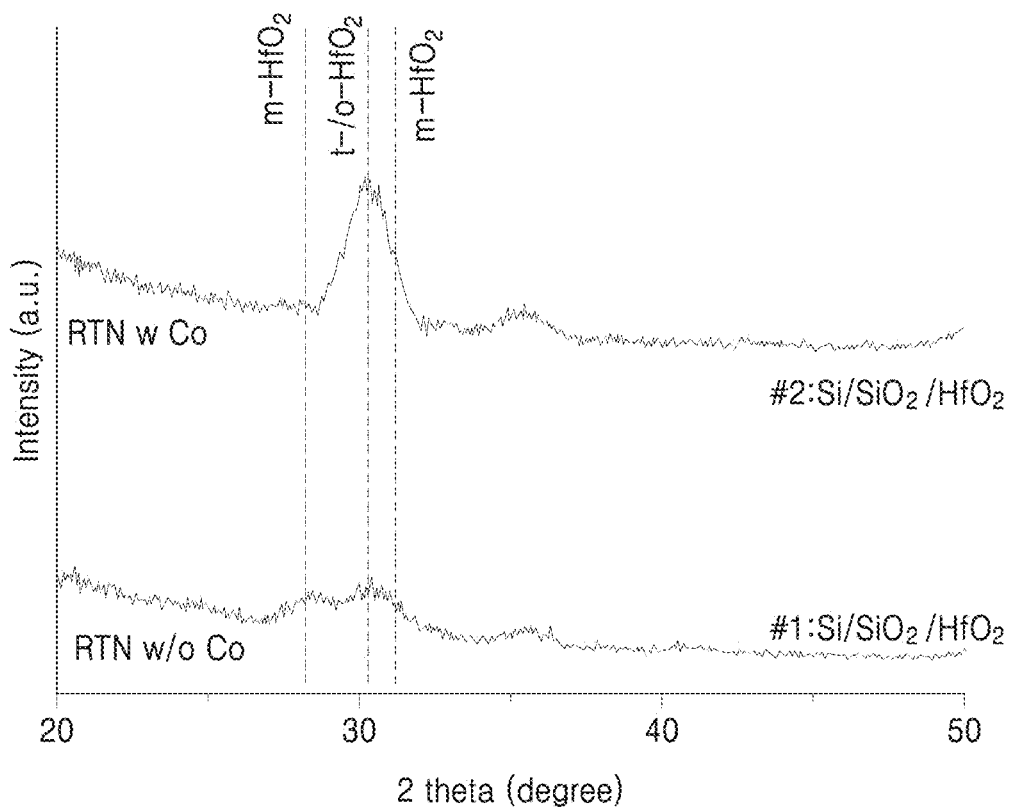
FIG. 10 shows a variation in an intensity of the layer structure illustrated in FIG. 9 according to a diffraction angle in an X-ray diffraction analysis method.

FIG. 10 shows a variation in an intensity of the layer structure illustrated in FIG. 9 according to a diffraction angle in an X-ray diffraction analysis method. #1 indicates a variation in an intensity of a structure after being heat-treated when HfCoOx is not present; #2 indicates a variation in an intensity of a structure after being heat-treated when HfCoOx is present. In the layer structure of #2, a peak value occurs at around 30 degrees, indicating that HfO₂ is crystallized in the layer structure of #2. In the graph of FIG. 10, "m" indicates monoclinic crystallization and "t" denotes tetragonal crystallization.

The semiconductor device according to the various embodiments including a hafnium oxide layer having a tetragonal phase may be applied to a high-k capacitor for dynamic random access memories (DRAMs). Also, the semiconductor device according to the various embodiments including a hafnium oxide layer having an orthorhombic phase may be applied to a ferroelectric field effect transistor (Fe-FET) via a ferroelectric HfO₂ thin film.

Figure 11:
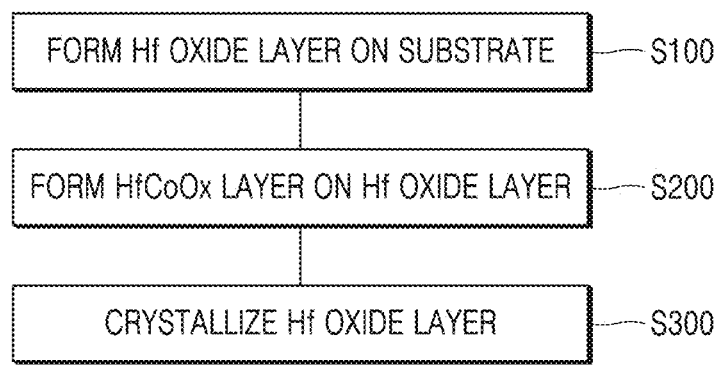
FIG. 11 illustrates a method of manufacturing a semiconductor device, according to an embodiment.

FIG. 11 illustrates a method of manufacturing a semiconductor device, according to an embodiment. The method of manufacturing a semiconductor device will be described with reference to FIGS. 1 and 11.

According to the method of manufacturing a semiconductor device, a hafnium oxide (HfOx) layer 120 is formed on a substrate 110 (S100). The hafnium oxide layer 120 may be formed using, for example, an atomic layer deposition method. The substrate 110 may include at least one material selected from the group consisting of Al, Si, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, BaHf, Ta, W, Re, Os, Ir, Pt, and Au or a material including the at least one material and a nitride or an oxide. The hafnium oxide layer 120 may have, for example, a thickness equal to or less than 7 nm.

A hafnium cobalt oxide (HfCoOx) layer 130 may be formed on the hafnium oxide layer 120 (S200). The hafnium cobalt oxide layer 130 may have a thickness of, for example, 3 nm or less. The hafnium cobalt oxide layer 130 may have a cobalt content of 10% or less.

The hafnium oxide layer 120 may be crystallized using a heat treatment process (S300). In an embodiment, the hafnium cobalt oxide layer 130 may act as a seed layer to crystallize the hafnium oxide layer 120. A hafnium oxide has a stable monoclinic phase and is thus more difficult crystallize orthorhombically or tetragonally. Crystallization of a hafnium oxide layer into orthorhombic crystals or tetragonal crystals has been tried using a doping and thin film process, but it is difficult to obtain a layer having a thickness of 7 nm or less by the doping and thin film process. A heat treatment process may be performed, for example, at a temperature equal to or higher than 400 degrees or equal to or lower than 1000 degrees. A hafnium cobalt oxide layer may also be removed after crystallization. Also, an electrode may be further formed on a hafnium cobalt oxide layer.

According to the method of manufacturing a semiconductor device of the various embodiments, a thin-film hafnium oxide layer may be crystallized by using a hafnium silicon oxide layer as a seed, and a ferroelectric HfO₂ thin film may be manufactured therefrom. A Fe-FET device or a MIM capacitor may be manufactured by using the ferroelectric HfO₂ thin film.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A semiconductor device in which a field effect transistor and a capacitor are electrically connected,
    wherein the field effect transistor comprises a semiconductor layer which includes a source and a drain, a dielectric layer on the semiconductor layer, and a gate electrode on the dielectric layer,
    wherein the capacitor comprises a first electrode, a second electrode disposed to be spaced apart from the first electrode, a hafnium oxide (HfOx) layer crystallized and disposed between the first electrode and the second electrode, and a seed layer on the hafnium oxide layer,
    wherein the seed layer comprises a hafnium cobalt oxide (HfCoOx) or hafnium silicon oxide (HfSiOx), and
    wherein the hafnium oxide layer has a permittivity in a range from about 30 to about 70.

2. The semiconductor device of claim 1, wherein the hafnium oxide layer further comprises ZrO2 or Al2O3.

3. The semiconductor device of claim 1, wherein the hafnium oxide layer has a thickness equal to or less than 7 nm.

4. The semiconductor device of claim 1, wherein the seed layer has a thickness equal to or less than 3 nm.

5. The semiconductor device of claim 1, wherein at least one of the first or second electrodes comprises at least one material selected from the group consisting of Al, Si, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, BaHf, Ta, W, Re, Os, Ir, Pt, and Au or a material including the at least one material and a nitride or an oxide.

6. The semiconductor device of claim 1, wherein the hafnium oxide layer is crystallized in an orthorhombic phase or a tetragonal phase.

7. The semiconductor device of claim 1, further comprising:
   a silicon dioxide layer between the first electrode and the hafnium oxide layer.

8. The semiconductor device of claim 1, wherein the seed layer further includes at least one material selected from the group consisting of Be, B, Na, Mg, Al, K, Ca, Sc, Ti, V, Cr, Mn, Fe, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Ta, W, Re, Os, Ir, Pt, Au, Hg, Tl, Pb, Bi, Po, Fr, Ra, Ac, Th, Pa, and U.

9. The semiconductor device of claim 1, wherein the seed layer has a cobalt content of 10% or less.

10. A dynamic random access memory (DRAM) comprising the semiconductor device of claim 1.

* * * * *